(12) United States Patent
Behzad

(10) Patent No.: US 7,873,332 B2
(45) Date of Patent: Jan. 18, 2011

(54) METHOD AND SYSTEM FOR MITIGATING A VOLTAGE STANDING WAVE RATIO

(75) Inventor: Arya Behzad, Poway, CA (US)

(73) Assignee: Broadcom Corporation, Irvine, CA (US)

( * ) Notice: Subject to any disclaimer, the term of this patent is extended or adjusted under 35 U.S.C. 154(b) by 817 days.

(21) Appl. No.: 11/618,181

(22) Filed: Dec. 29, 2006

(65) Prior Publication Data

US 2008/0139144 A1 Jun. 12, 2008

Related U.S. Application Data

(60) Provisional application No. 60/868,818, filed on Dec. 6, 2006.

(51) Int. Cl.
 *H04B 1/04* (2006.01)
(52) U.S. Cl. .............. 455/126; 455/127.1; 455/103; 455/430; 455/522; 455/151.1
(58) Field of Classification Search ............... 455/126, 455/127, 103, 430, 522, 115, 116
See application file for complete search history.

(56) References Cited

U.S. PATENT DOCUMENTS

| | | | | |
|---|---|---|---|---|
| 4,949,090 A | * | 8/1990 | Tamii et al. | 342/173 |
| 5,093,667 A | * | 3/1992 | Andricos | 342/372 |
| 5,349,300 A | | 9/1994 | Matz et al. | |
| 5,809,420 A | * | 9/1998 | Ichiyanagi et al. | 455/103 |
| 5,937,011 A | | 8/1999 | Carney et al. | |
| 6,438,387 B1 | * | 8/2002 | Ichikawa | 455/522 |
| 7,545,321 B2 | * | 6/2009 | Kawasaki | 342/368 |
| 2006/0119426 A1 | | 6/2006 | Ichitsubo et al. | |
| 2006/0202757 A1 | | 9/2006 | Ichitsubo et al. | |
| 2006/0232338 A1 | * | 10/2006 | Park et al. | 330/280 |

FOREIGN PATENT DOCUMENTS

| | | |
|---|---|---|
| EP | 1 326 330 | 7/2003 |
| EP | 1 453 210 | 9/2004 |

OTHER PUBLICATIONS

European Search Report for European Patent Application Serial No. 07013493.7-2215, dated Jul. 22, 2009.

* cited by examiner

*Primary Examiner*—Sanh D Phu
(74) *Attorney, Agent, or Firm*—McAndrews, Held & Malloy, Ltd.

(57) ABSTRACT

Methods and systems for mitigating a voltage standing wave ratio in a transmitter are disclosed and may comprise calibrating an output power of a power amplifier integrated within a chip using a resistor that models an impedance of an antenna that is externally coupled to the amplifier while the antenna is decoupled. The gain and output power of the amplifier may be determined utilizing the known resistance and a voltage that is measured at an input of the power amplifier, or at a number of points prior to the power amplifier. When the antenna may be coupled to the transmitter, the transmitter output power may then be controlled utilizing the voltage measurements prior to the power amplifier to avoid measuring reflected waves in instances when the antenna impedance may vary. The power amplifier may be of a design that comprises reverse isolation to reduce reflected waves from the antenna.

26 Claims, 5 Drawing Sheets

METHOD AND SYSTEM FOR MITIGATING A VOLTAGE STANDING WAVE RATIO

CROSS-REFERENCE TO RELATED APPLICATIONS/INCORPORATION BY REFERENCE

This application makes reference to, claims priority to, and claims the benefit of U.S. Provisional Application Ser. No. 60/868,818, filed on Dec. 6, 2006.

The above stated application is hereby incorporated herein by reference in its entirety.

FEDERALLY SPONSORED RESEARCH OR DEVELOPMENT

[Not Applicable]

MICROFICHE/COPYRIGHT REFERENCE

[Not Applicable]

FIELD OF THE INVENTION

Certain embodiments of the invention relate to power amplifiers. More specifically, certain embodiments of the invention relate to a method and system for mitigating a voltage standing wave ratio.

BACKGROUND OF THE INVENTION

A power amplification circuit in a wireless system is typically a large signal device. In wireless local area network (WLAN) systems, the power amplifier (PA) circuit may transmit output signals at average power levels in the range of 10 dBm to 20 dBm, and peak power levels of about 20 to 30 dBm, for example. In such WLAN systems, which may, for example, utilize a wide range of modulation types from binary phase shift keying (BPSK) to 512 level quadrature amplitude modulation (512-QAM), output power levels may vary widely such that the ratio of the peak power level to the average power level may be large, for example, 10 dBm to 15 dBm.

The power output of a PA can be affected by the impedance of the antenna. The output impedance of a properly designed PA is matched to the impedance of the antenna. If for some reason the antenna impedance changes, this may cause a reflection in the signal at the antenna back to the PA, which is known as voltage standing wave ratio (VSWR). With a VSWR of greater than 1, the output power of the PA may vary as gain control circuitry attempts to compensate for the output voltage swing due the reflected signal. One current approach utilized in an attempt to reduce VSWR is with external discrete directional couplers.

Limitations in the performance of PA circuitry may be exacerbated when the PA is integrated in a single integrated circuit (IC) device with other radio frequency (RF) transmitter circuitry [such as digital to analog converters (DAC), low pass filters (LPF), mixers, and RF programmable gain amplifiers (RFPGA)]. Whereas the pressing need to increase the integration of functions performed within a single IC, and attendant increase in the number of semiconductor devices, may push semiconductor fabrication technologies toward increasingly shrinking semiconductor device geometries, these very semiconductor fabrication technologies may impose limitations on the performance of the integrated PA circuitry. For example, utilizing a 65 nm CMOS process may restrict the range of input power levels for which the PA provides linear output power level amplification. Requirements for AM-AM and/or AM-PM distortion levels as set forth in a WLAN standard, such as IEEE 802.11, may preclude transmitting output signals at high output power levels for PA circuitry that is fabricated utilizing a 65 nm CMOS process, for example.

Further limitations and disadvantages of conventional and traditional approaches will become apparent to one of skill in the art, through comparison of such systems with the present invention as set forth in the remainder of the present application with reference to the drawings.

BRIEF SUMMARY OF THE INVENTION

A system and/or method for mitigating a voltage standing wave ratio on transmit power or transmit power control loop, substantially as shown in and/or described in connection with at least one of the figures, as set forth more completely in the claims.

Various advantages, aspects and novel features of the present invention, as well as details of an illustrated embodiment thereof, will be more fully understood from the following description and drawings.

DETAILED DESCRIPTION OF THE INVENTION

Certain aspects of the invention may be found in a method and system for controlling a circuit within a transmitter. Aspects of the invention may comprise calibrating an output power of a power amplifier integrated within a chip using an on-chip resistor that models an impedance of an antenna that is externally coupled to the amplifier while the antenna is decoupled. The gain and output power of the amplifier may be determined utilizing the known resistance and a voltage that is measured at an input of the power amplifier, or at a number of points prior to the power amplifier. When the antenna is coupled to the transmitter, the transmitter output power may then be controlled utilizing the voltage measurements prior to the power amplifier to, for example, avoid measuring reflected waves in instances when the antenna impedance may vary. The power amplifier may be of a design that comprises reverse isolation to reduce reflected waves from the antenna.

Figure 1A:
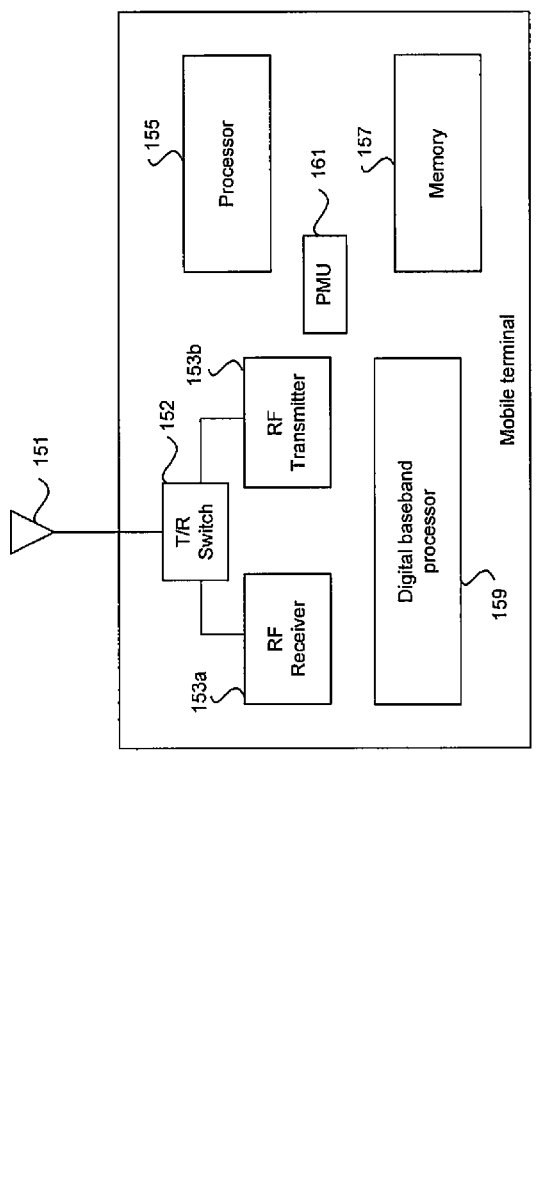
FIG. 1A is a block diagram illustrating an exemplary mobile terminal, which may be utilized in connection with an embodiment of the invention.

FIG. 1A is a block diagram illustrating an exemplary mobile terminal, which may be utilized in connection with an embodiment of the invention. Referring to FIG. 1A, there is shown mobile terminal 150 that may comprise an RF receiver 153a, an RF transmitter 153b, a T/R switch 152, a digital baseband processor 159, a processor 155, a power management unit (PMU) 161 and a memory 157. An antenna 151 may be communicatively coupled to the T/R switch 152. In instances when the T/R switch 152 is set to "R", or receive, the antenna 151 may be communicatively coupled to the RF receiver 153a, and in instances when the T/R switch 152 is set to "T", or transmit, the antenna 151 may be communicatively coupled to the RF transmitter 153b.

The RF receiver 153a may comprise suitable logic, circuitry, and/or code that may enable processing of received RF signals. The RF receiver 153a may enable receiving of RF signals in frequency bands utilized by various wireless communication systems, such as Bluetooth, WLAN, GSM, and/or WCDMA, for example.

The digital baseband processor 159 may comprise suitable logic, circuitry, and/or code that may enable processing and/or handling of baseband signals. In this regard, the digital baseband processor 159 may process or handle signals received from the RF receiver 153a and/or signals to be transferred to the RF transmitter 153b for transmission via a wireless communication medium. The digital baseband processor 159 may also provide control and/or feedback information to the RF receiver 153a and to the RF transmitter 153b, based on information from the processed signals. The digital baseband processor 159 may communicate information and/or data from the processed signals to the processor 155 and/or to the memory 157. Moreover, the digital baseband processor 159 may receive information from the processor 155 and/or the memory 157, which may be processed and transferred to the RF transmitter 153b for transmission to the wireless communication medium.

The RF transmitter 153b may comprise suitable logic, circuitry, and/or code that may enable processing of RF signals for transmission. The RF transmitter 153b may enable transmission of RF signals in frequency bands utilized by various wireless communications systems, such as Bluetooth, WLAN, GSM and/or WCDMA, for example.

The processor 155 may comprise suitable logic, circuitry, and/or code that may enable control and/or data processing operations for the mobile terminal 150. The processor 155 may be utilized to control at least a portion of the RF receiver 153a, the RF transmitter 153b, the digital baseband processor 159, and/or the memory 157. In this regard, the processor 155 may generate at least one signal for controlling operations within the mobile terminal 150.

The memory 157 may comprise suitable logic, circuitry, and/or code that may enable storage of data and/or other information utilized by the mobile terminal 150. For example, the memory 157 may be utilized for storing processed data generated by the digital baseband processor 159 and/or the processor 155. The memory 157 may also be utilized to store information, such as configuration information, that may be utilized to control the operation of at least one block in the mobile terminal 150. For example, the memory 157 may comprise information necessary to configure the RF receiver 153a to enable receiving RF signals in the appropriate frequency band.

The power management unit 161 may comprise suitable logic, circuitry, and/or code that may enable the management of the power requirements of the components within the mobile terminal 150. The PMU 161 may generate a battery voltage signal, $V_{bat}$.

Figure 1B:
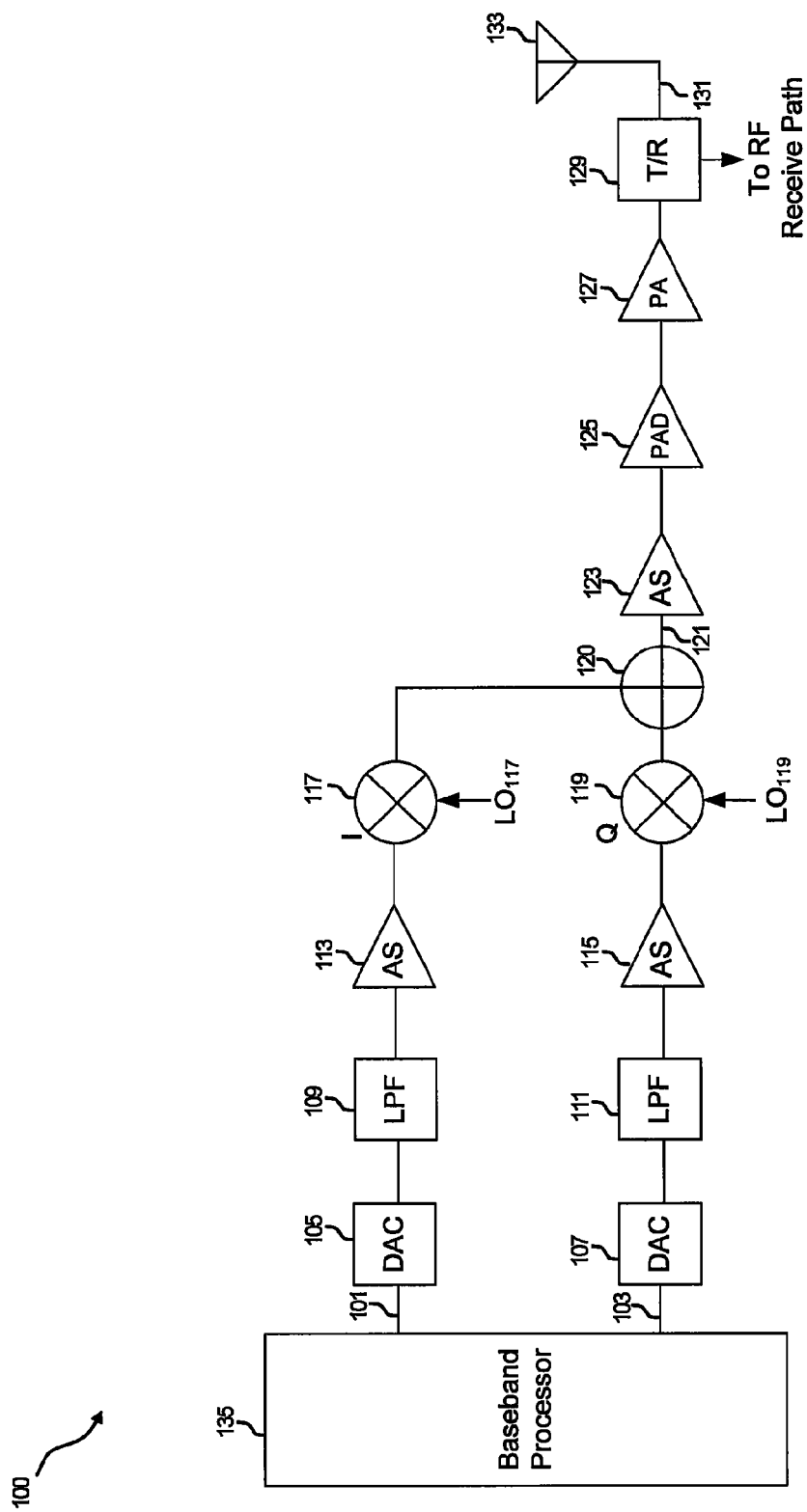
FIG. 1B is a block diagram of an exemplary I and Q transmit path, in accordance with an embodiment of the invention.

FIG. 1B is a block diagram of an exemplary I and Q transmit path, in accordance with an embodiment of the invention. Referring to FIG. 1B, there is shown transmit path 100 comprising digital to analog converters (DAC) 105 and 107, low pass filters 111 and 109, active stages (ASs) 113, 115, and 123, in-phase and quadrature up-conversion mixers 117 and 119, respectively, an adder 120, a power amplifier driver (PAD) 125, a power amplifier (PA) 127, a transmit/receive (T/R) switch 129, and an antenna 133. The in-phase path comprises the DAC 105, the LPF 109, the AS 113 and the in-phase up-conversion mixer 117. The quadrature path comprises the DAC 107, the LPF 111, the AS 115 and the quadrature up-conversion mixer 119. The exemplary polar transmitter 100 of FIG. 1B may be representative of the RF transmitter 153b of FIG. 1A.

The DAC 105 may comprise suitable circuitry, logic and/or code for converting a digital signal to an analog output. The DAC 105 may be enabled to receive an input signal, namely in-phase digital IF signal 101. The input digital signal may comprise one or more bits, which may represent a numerical value. The input digital signal may be a baseband signal, which may be mapped to a constellation point based on a modulation type. The mapped constellation point may be represented by an analog signal amplitude. The number of bits represented by an analog signal amplitude, or symbol, may be determined based on the modulation type. The DAC 105 may be enabled to generate an analog output signal, which may be communicated to an input of the low pass filter 109. The DAC 107 may be substantially similar to the DAC 105. Notwithstanding, the DAC 107 may be enabled to receive an input signal 103 from the baseband processor 135, and accordingly, generate an analog signal, which may be communicated to an input of the low pass filter 111.

The LPF 109 may comprise suitable circuitry, logic and/or code that may enable selection of a cutoff frequency, wherein the LPF 109 may attenuate the amplitudes of input signal components for which the corresponding frequency is higher than the cutoff frequency, while the amplitudes of input signal components for which the corresponding frequency is less than the cutoff frequency may "pass," or not be attenuated, or attenuated to a lesser degree than input signal components at frequencies higher than the cutoff frequency. In various embodiments of the invention, the LPF 109 may be implemented as a passive filter, such as one that utilizes resistor, capacitor, and/or inductor elements, or implemented as an active filter, such as one that utilizes an operational amplifier. The LPF 111 may be substantially similar to LPF 109. Notwithstanding, the LPF 111 may be enabled to receive an analog input signal from the DAC 107, and accordingly, generate a low pass filtered signal, which may be communicated to an input of the active stage 115.

The AS 113 may comprise suitable circuitry, logic and/or code that may enable attenuation of input signals to generate an attenuated output signal. The amount of attenuation that may be provided by the AS 113, as measured in dB for example, may be determined based on an input control signal, which may be generated by the processor 155 described with respect to FIG. 1A. The AS 113 may be enabled to receive an output signal generated by the LPF 109. The AS 113 may be enabled to generate an output signal with applied gain or attenuation that may be communicated to the in-phase up-conversion mixer 117. The AS 115 may be substantially similar to the AS 113. Notwithstanding, an input of the AS 115 may be coupled to an output of the low pass filter 111 and an output of the AS 115 may be coupled to an input of the mixer 119.

The in-phase up-conversion mixer 117 may comprise suitable circuitry, logic and/or code that may enable generation of an RF signal by modulation of an input signal. The in-phase up-conversion mixer 117 may utilize an input local oscillator signal labeled as LO117 to modulate the input signal. The modulated signal may be an RF signal. The transmitter in-phase up-conversion mixer 117 may produce an RF signal for which the carrier frequency may be approximately equal to the frequency of the signal LO117. The in-phase up-conversion mixer 117 may be enabled to receive an output signal generated by the active stage 113 and to generate an output signal that may be communicated to the adder 120. The quadrature up-conversion mixer 119 may be substantially similar to in-phase up-conversion mixer 117. Notwithstanding, an input of the quadrature up-conversion mixer 119 may be coupled to an input of the adder 120.

The adder 120 may comprise suitable circuitry, logic and/or code for receiving analog input signals and generating an output signal that may be a sum of the incoming signals. The adder 120 may be enabled to receive output signals generated by the in-phase up-conversion mixer 117 and quadrature up-conversion mixer 119, resulting in the signal 121.

The AS 123 may comprise suitable circuitry, logic and/or code that may enable attenuation of input signals to generate an attenuated output signal. The amount of attenuation that may be provided by the AS 123, as measured in dB for example, may be determined based on an input control signal, which may be generated by the processor 155 described with respect to FIG. 1A. The AS 123 may be enabled to receive an output signal generated by the adder 120. The AS 123 may be enabled to generate an output signal with applied gain or attenuation that may be communicated to the PAD 125.

The PAD 125 may comprise suitable circuitry, logic and/or code for receiving analog input signals and generating an output signal for driving a power amplifier. The PAD 125 may receive as inputs, control signals, which may be generated by the processor 155. The received control signal may be utilized to set a gain or attenuation level of the PAD 125. The PAD 125 may be enabled to receive the output signal generated by the AS 123. The PAD 115 may be enabled to generate an output signal that may be communicated to the PA 127.

The PA 127 may comprise suitable circuitry, logic and/or code that may enable amplification of input signals to generate a transmitted signal of sufficient signal power (as measured by dBm, for example) for transmission via a wireless communication medium. The PA 127 may receive as inputs, control signals, which may be generated by the processor 155. The received control signal may be utilized to set a gain or attenuation level of the PA 127.

The transmit/receive (T/R) switch 129 may comprise suitable circuitry, logic and/or code for switching the antenna 133 between the transmit path 100 and an RF receiver. The antenna 133 may comprise suitable circuitry for transmitting or receiving an RF signal.

The baseband processor 135 may comprise suitable logic, circuitry, and/or code that may enable processing of binary data contained within an input baseband signal. The baseband processor 135 may be substantially similar to the digital baseband processor 159 described with respect to FIG. 1A. The baseband processor 135 may perform processing tasks, which correspond to one or more layers in an applicable protocol reference model (PRM). For example, the baseband processor 135 may perform physical (PHY) layer processing, layer 1 (L1) processing, medium access control (MAC) layer processing, logical link control (LLC) layer processing, layer 2 (L2) processing, and/or higher layer protocol processing based on input binary data. The processing tasks performed by the baseband processor 135 may be referred to as being within the digital domain. The baseband processor 135 may also generate control signals based on the processing of the input binary data.

In operation, the baseband processor 135 may generate data comprising a sequence of bits to be transmitted via a wireless communications medium. The baseband processor 135 may generate a control signal, which may be utilized to configure the RF transmit path 100 to transmit the data by utilizing a specified modulation type. Based on the specified modulation type, the baseband processor may send a portion of the data, an in-phase baseband (IBB) signal, to the DAC 105, and another portion of the data, a quadrature baseband (QBB) signal, to the 107. The DAC 105 may receive a sequence of bits and generate an analog signal comprising a sequence of symbols. The number of bits represented by an individual symbol may be determined based on the specified modulation type. The DAC 107 may similarly generate an analog signal.

The analog signals generated by the DAC 105 and the DAC 107 may comprise undesirable frequency components. The LPF 109 and the LPF 111 may attenuate signal amplitudes associated with these undesirable frequency components in signals generated by the DAC 105 and the DAC 107 respectively. The baseband processor 135 may configure the in-phase up-conversion mixer 117 to select a frequency for the LO117 signal utilized to modulate the filtered signal from the LPF 109. The modulated signal output from the in-phase up-conversion mixer 117 may comprise an I component RF signal. The baseband processor 135 may similarly configure the quadrature up-conversion mixer 119 to generate a Q component RF signal from the filtered signal from the LPF 111. The signals may be summed by the adder 120 at the output of the two mixers 117 and 119 to generate the combined modulated signal.

The AS 123 may amplify the combined RF signals, wherein the level of amplification provided by the AS 123 may be configured based on control signals generated by the baseband processor 135. The PAD 125 may provide a second stage of amplification for the signal generated by the AS 123, and the PA 127 may provide a third stage of amplification for the signal generated by the PAD 125. The amplified signal from the PA 127 may be transmitted to the wireless communications medium via the transmit antenna 133 in instances where the T/R switch 129 is set to "T", or transmit mode.

Figure 2:
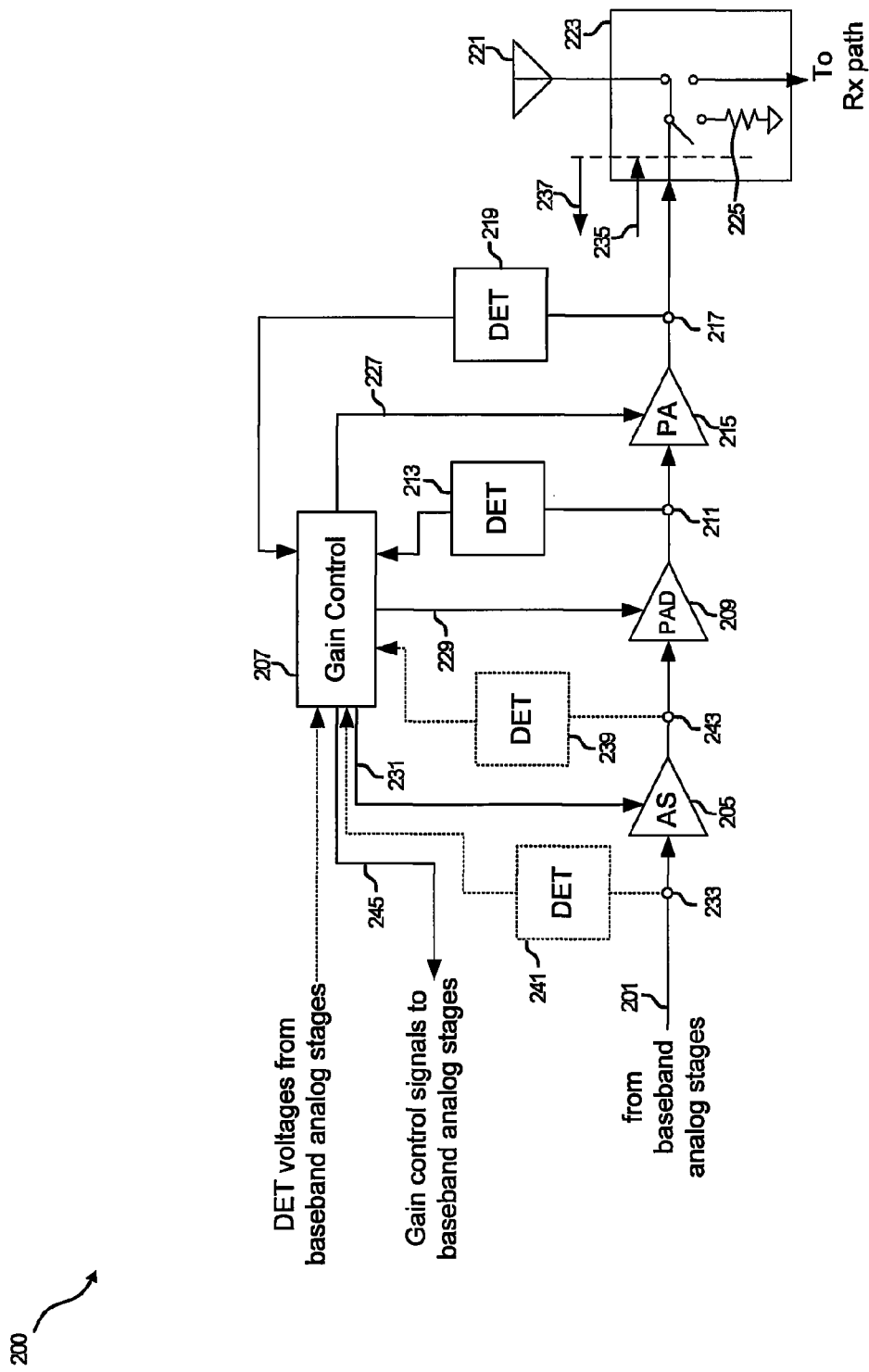
FIG. 2 is a block diagram of the output stages of an exemplary transmit path in transmit mode, in accordance with an embodiment of the invention.

FIG. 2 is a block diagram of the output stages of an exemplary transmit path in transmit mode, in accordance with an embodiment of the invention. Referring to FIG. 2, there is shown transmit path 200 comprising an active stage 205, a gain control block 207, a PAD 209, voltage detectors 213, 219, 239 and 241, a PA 215, a T/R switch 223 with a load resistor 225, and an antenna 221. The load resistor 225 may have a resistance value designed to match the impedance of the antenna 221 and the output impedance of the PA 215, 50Ω, for example.

The active stage 205 may comprise suitable circuitry, logic and/or code that may enable attenuation of input signals to generate an attenuated output signal, wherein the amount of attenuation, as measured in dB for example, may be determined based on an input control signal. The active stage 205 may be enabled to receive an output signal generated by the baseband analog stages, described with respect to FIG. 1B. The active stage may be enabled to generate an output signal with applied gain or attenuation that may be communicated to the PAD 209.

The PAD 209 may comprise suitable circuitry, logic and/or code for receiving analog input signals and generating an output signal for driving a power amplifier. The PAD 209 may receive as inputs, control signals from the gain control block 207 to set a gain or attenuation level of the PAD 209. The PAD 209 may be enabled to receive the output signal 243 generated by the active stage 205. The PAD 209 may be enabled to generate an output signal that may be communicated to the PA 215.

The PA 215 may comprise suitable circuitry, logic and/or code that may enable amplification of input signals to generate a transmitted signal of sufficient signal power (as measured by dBm, for example) for transmission via a wireless communication medium. The PA 215 may receive as inputs, control signals from the gain control block 207 to set a gain or attenuation level of the PA 215, and generate an output signal that may be communicated to the transmit/receive (T/R) switch 223.

The T/R switch 223 may comprise suitable circuitry, logic and/or code for switching the antenna 221 between the transmit path 100 and an Rx path. The antenna 221 may comprise suitable circuitry for transmitting an RF signal. The resistor 225 may be integrated within the T/R switch 223.

The voltage detectors 213, 219, 239 and 241 may comprise suitable circuitry, logic and/or code for detecting a voltage level of a signal. In one embodiment of the invention, the voltage detectors 213, 219, 239 and 241 may comprise envelope detectors. The voltage detectors 239 and 241 are indicated by dashed lines in FIG. 2, as they are optional locations for more voltage detectors and may be incorporated in addition to the voltage detectors 213 and 219. The voltage detectors 213, 219, 239 and 241 may be enabled to sense a voltage level and generate a signal to be communicated to the gain control block 207.

In operation, the transmit path 200, when in transmit mode, may be intended for receiving an analog input signal 201 and applying an appropriate gain to the signal such that the power transmitted by the antenna 221 may be at a desired level. The input signal 201 may be communicated to the active stage 205 and provide gain or attenuation at a level determined by the gain control signal 231 from the gain control block 207. The output signal of the active stage 205 may be communicated to the PAD 209. The PAD 209 may provide gain or attenuation at a level determined by the gain control signal 229 from the gain control block 207. The output signal 211 of PAD 209 may be communicated to the PA 215. The voltage of the output signal 211 may be measured by the voltage detector 213 and may be communicated to the gain control block 207. The PA 215 may provide gain or attenuation at a level determined by the gain control signal 227 from the gain control block 207. The output impedance of the PA 215 may be designed to match that of the antenna 221, 50Ω, for example, to avoid reflections of the output signal 217 at the antenna. The voltage output 217 of the PA 215 may be measured by the voltage detector 219 and communicated to the gain control block 207. The output signal 217 of the PA 215 may be communicated to the input of the switch 223. The switch 223 may couple the antenna 221 to the transmit path 200 or the receive path. In transmit mode, the switch 223 may couple the transmit path 200 to the antenna 221, such that the output signal 217 received from the PA 215 may be transmitted by the antenna.

The gain control block 207 may receive the voltage signals from voltage detectors 213, 219, 239 and 241 and may generate the gain control signals 227, 229, 231 and 245. By comparing the voltage of the output signal 217 to that of the output signal 211, the gain of the PA 215 may be determined. However, in cases where the impedance of the antenna 221 is not constant, such as when it is touched or objects are placed nearby, the forward signal 235 may be reflected due to the mismatch of the output impedance of the PA 215 versus the antenna 221. In instances where the impedances are not matched, when the reflected signal 237 reaches the PA 215, it may have a phase difference from the forward signal 235 such that the two signals constructively interfere, making the voltage of the output signal 217 measured by the voltage detector 219 erroneously high. Similarly, the reflected signal 237 may reach the PA 215 with a phase difference from the forward signal 235 such that the signals destructively interfere, causing the voltage of the output signal 217 measured by the voltage detector 219 to be erroneously low.

In prior art embodiments of RF transmitters, the voltage variations due to signal reflections may cause the transmit path to have large output power variations. Prior art embodiments may also use directional couplers. Directional couplers work by detecting only the forward wave and ignoring the reflected wave. If the output of the directional coupler may be connected to a voltage (envelope) detector, the resultant output may not be impacted by antenna reflections. However, directional couplers are typically too large at the frequencies of interest to be integrated on a silicon substrate and therefore require external components adding cost and size to the solution.

In the present invention, the large output power variations may be mitigated by utilizing a second voltage detector, the voltage detector 213, between the PAD 209 and the PA 215, for example. The second voltage detector may be placed at any stage prior to the PA 215. The PA 215 may be of a design such that the reverse isolation may be high, such as in a CMOS cascode design, reducing the gain of a signal traveling in the reverse direction. In this manner, the voltage of the output signal 211 may be isolated from reflected waves, and the gain control block may more accurately control the gain of the transmit path 200.

Figure 3:
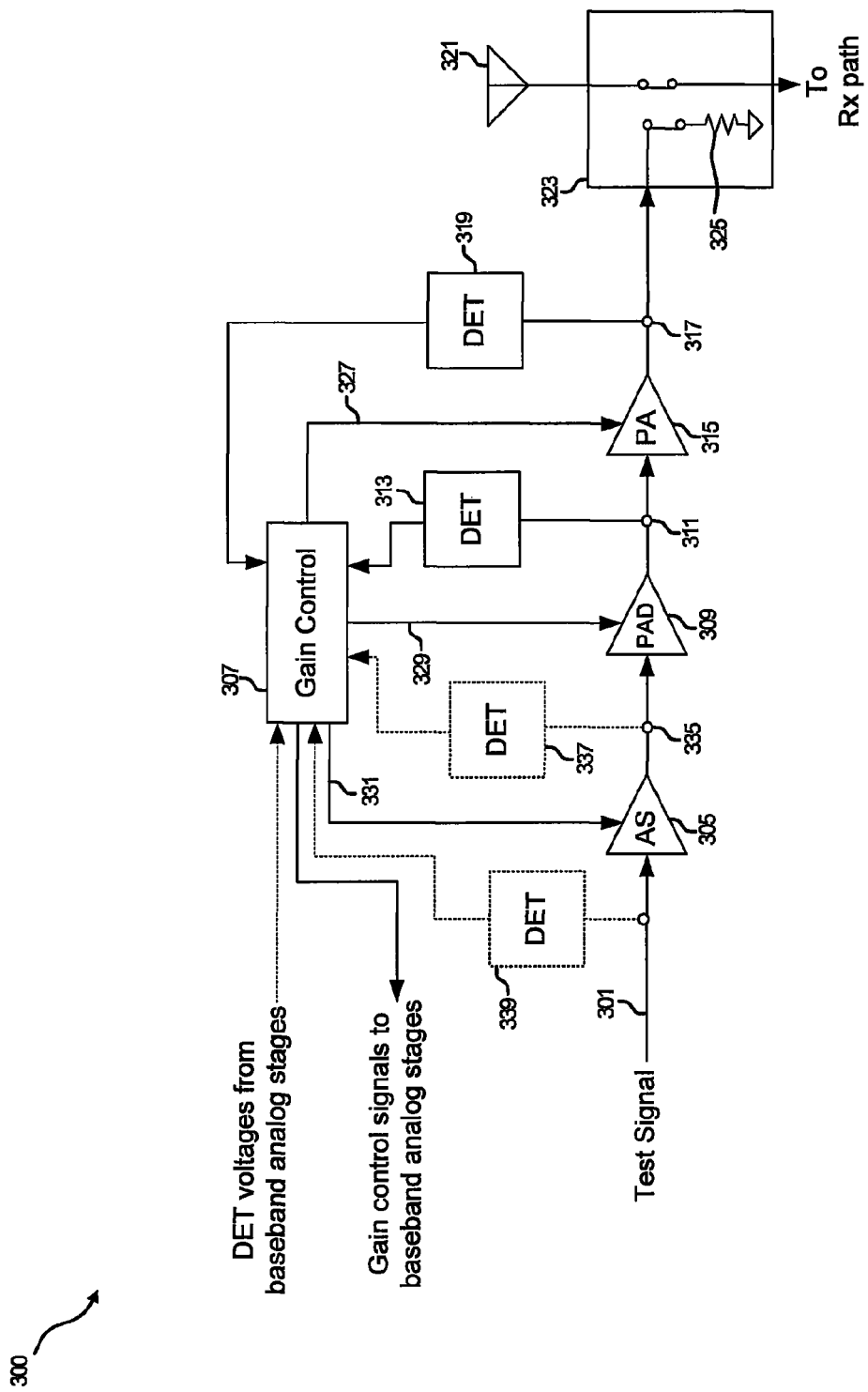
FIG. 3 is a block diagram of the output stages of an exemplary transmit path in calibration/receive mode, in accordance with an embodiment of the invention.

FIG. 3 is a block diagram of the output stages of an exemplary transmit path in calibration/receive mode, in accordance with an embodiment of the invention. Referring to FIG. 3, there is shown transmit path 300 in calibration/receive mode comprising an active stage 305, a gain control block 307, a PAD 309, voltage detectors 313, 319, 337 and 339, a PA 315, a T/R switch 323 with a load resistor 325 and an antenna 321, which may be substantially similar to the active stage 205, the gain control block 207, the PAD 209, voltage detectors 213, 219, 239 and 241, the PA 215, the T/R switch 223, the load resistor 225 and the antenna 221 described with respect to FIG. 2. In one embodiment of the invention, the voltage detectors 313, 319, 337 and 339 may comprise envelope detectors.

The test signal 301 generated by the baseband analog stages, described with respect to FIG. 1B, may be communicated to an input of the active stage 305. An output of the gain control block 307 may be coupled to another input of the active stage 305. The output of the active stage 305 may be coupled to an input of the PAD 309. The output of the PAD 309 may be coupled to an input of the PA 315. One terminal of the voltage detector 313 may be coupled to the output of the PAD 309, and the other terminal of the voltage detector may be coupled to an input of the gain control block 307. An output of the gain control block 307 may be coupled to another input of the PA 315. The output of the PA 315 may be coupled to the switch 323. One terminal of the voltage detector 319 may be coupled to the output of the PA 315, and the other terminal of the voltage detector 319 may be coupled to an input of the gain control block 307. One terminal of the voltage detector 337 may be coupled to the output of the active stage 305, and the other terminal of the voltage detector 337 may be coupled to the gain control block 307. One terminal of the voltage detector 339 may be coupled to the input of the active stage 305, and the other terminal of the voltage detector 339 may be coupled to the gain control block 307. The T/R switch 323 may couple the antenna 321 to the receive path, and the transmit path 300 to the load resistor 325.

In operation, the transmit path 300, when in calibration/receive mode, may be enabled for receiving a test signal 301, generated by the baseband analog stages described with respect to FIG. 1B, applying a desired gain to the signal, and measuring the voltages of the signals 301, 311, 317 and 335. The test signal 301 may be communicated to the active stage 305. The active stage 305 may receive the test signal 301 and provide gain or attenuation at a level determined by the gain control signal 331 from the gain control block 307. The output signal of the active stage 305 may be communicated to the PAD 309. The PAD 309 may provide gain or attenuation at a level determined by the gain control signal 329 from the gain control block 307. The output signal 311 of PAD 309 may be communicated to the PA 315. The voltage of the output signal 311 may be measured by the voltage detector 313 and may be communicated to the gain control block 307. The PA 315 may provide gain or attenuation at a level determined by the gain control signal 327 from the gain control block 307. The output impedance of the PA 315 may be designed to match that of the antenna 321, 50Ω, for example, to avoid reflections of the output signal 317 at the antenna. The voltage output 317 of the PA 315 may be measured by the voltage detector 319 and communicated to the gain control block 307. The output signal 317 of the PA 315 may be communicated to the T/R switch 323. The T/R switch 323 may couple the transmit path 300 to the antenna 321 or the load resistor 325.

In calibration/receive mode, the switch 323 may couple the transmit path 300 to the load resistor 325 and the antenna 321 to the receive path. In this manner, the transmit path 300 may be calibrated, at system startup, for example, with a known load impedance given by the load resistor 325, as opposed to the antenna 321 which may not have a constant impedance due to variations caused by touching the antenna 321 or by objects in the vicinity of the antenna 321. By comparing the voltages measured by the voltage detectors 319 and 313 when a known test signal 301 may be applied to the transmit path 300 with a known load impedance, the load resistor 325, the gain control system 307 may then have an accurate calibration of the gain of the PA 315.

In another embodiment of the invention, the calibration may be performed with the transmit path 300 coupled to the antenna, as opposed to the load resistor 325. The gain calibration may be similar to the case of a calibration utilizing the load resistor 325, but with the T/R switch set to "T", or transmit mode where the antenna may be coupled to the transmit path 300.

Figure 4:
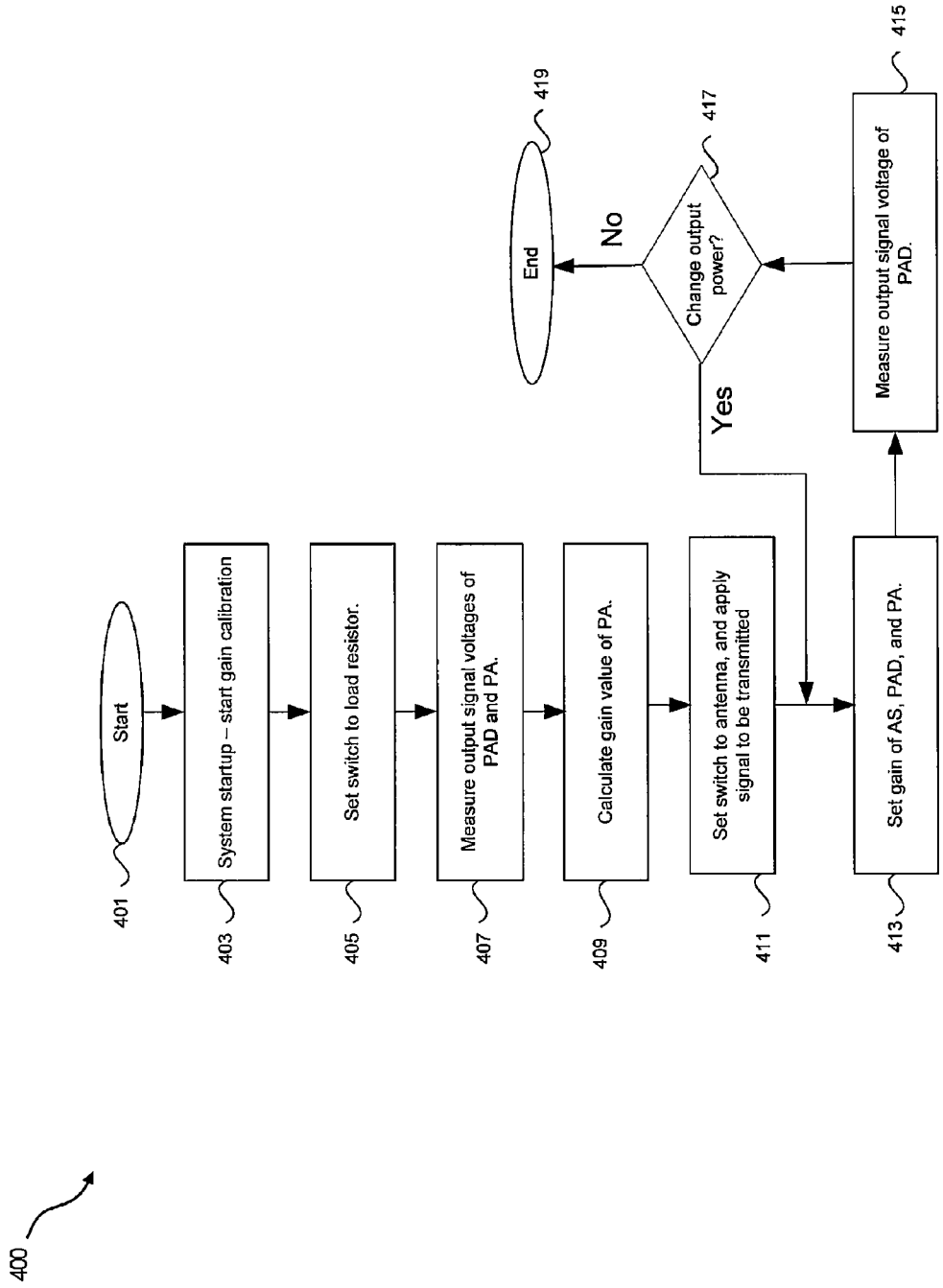
FIG. 4 is a flow diagram illustrating exemplary steps for a power amplifier calibration and control process, in accordance with an embodiment of the invention.

FIG. 4 is a flow diagram illustrating exemplary steps for a power amplifier power detector gain calibration and control process, in accordance with an embodiment of the invention. Referring to FIG. 4, there is shown flow diagram 400. After start step 401, in step 403 the gain calibration may begin. In step 405, the T/R switch 323 may be switched to the load resistor 325 so that the impedance is a known value for PA 315 calibration. In step 407, the output voltages 311 and 317 may be measured by voltage detectors 313 and 319, respectively. In step 409, the gain of the PA 315 may be determined from the measured output voltages 311 and 317. In step 411, the T/R switch 323 may be switched to the antenna 321 for setting the transmit path 300 to transmit mode. An input signal 201 may be communicated to the transmit path 200. In step 413, the gain of active stage 205, the PAD 209 and the PA 215 may be set by the gain control block 207 to result in a desired output power. In step 415, the voltage of the output signal 211 may be measured by voltage detector 213, and may be utilized to monitor the output power of the PA, independent of a signal that may be reflected back to the PA from the antenna 221 due to variations in the antenna 221 impedance. In step 417, if the output power may need to be changed, the process may proceed back to step 413. If not, the process may proceed to end step 419.

In an embodiment of the invention, a method and system are described for calibrating an output power of a power amplifier 315 integrated within a chip using an on-chip resistor 325 that models an impedance of an antenna 321 that is externally coupled to the power amplifier 315 while the antenna 321 is decoupled. The gain and output power of the power amplifier 315 may be determined utilizing the known resistance 325 and a voltage that is measured at an input of the power amplifier, or at a number of points prior to the power amplifier. When the antenna 321 may be coupled to the transmitter 300, the transmitter output power may then be controlled utilizing the voltage measurements prior to the power amplifier 315 to avoid measuring reflected waves in instances when the antenna impedance may vary. The power amplifier 315 may be designed to comprise reverse isolation to reduce reflected waves from the antenna 321. In another embodiment of the invention, the output power of the power amplifier 315 may be calibrated utilizing the antenna 321 and by measuring voltages at the input of the power amplifier 315 and a stage prior to the input of the power amplifier 315.

Certain embodiments of the invention may comprise a machine-readable storage having stored thereon, a computer program having at least one code section for communicating information within a network, the at least one code section being executable by a machine for causing the machine to perform one or more of the steps described herein.

Accordingly, aspects of the invention may be realized in hardware, software, firmware or a combination thereof. The invention may be realized in a centralized fashion in at least one computer system or in a distributed fashion where different elements are spread across several interconnected computer systems. Any kind of computer system or other apparatus adapted for carrying out the methods described herein is suited. A typical combination of hardware, software and firmware may be a general-purpose computer system with a computer program that, when being loaded and executed, controls the computer system such that it carries out the methods described herein.

One embodiment of the present invention may be implemented as a board level product, as a single chip, application specific integrated circuit (ASIC), or with varying levels integrated on a single chip with other portions of the system as separate components. The degree of integration of the system will primarily be determined by speed and cost considerations. Because of the sophisticated nature of modern processors, it is possible to utilize a commercially available processor, which may be implemented external to an ASIC implementation of the present system. Alternatively, if the processor is available as an ASIC core or logic block, then the commercially available processor may be implemented as part of an ASIC device with various functions implemented as firmware.

The present invention may also be embedded in a computer program product, which comprises all the features enabling the implementation of the methods described herein, and which when loaded in a computer system is able to carry out these methods. Computer program in the present context may mean, for example, any expression, in any language, code or notation, of a set of instructions intended to cause a system having an information processing capability to perform a particular function either directly or after either or both of the following: a) conversion to another language, code or notation; b) reproduction in a different material form. However, other meanings of computer program within the understanding of those skilled in the art are also contemplated by the present invention.

While the invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiments disclosed, but that the present invention will include all embodiments falling within the scope of the appended claims.

What is claimed is:

1. A method for controlling a circuit within a transmitter, the method comprising: calibrating an output power of a power amplifier integrated within a chip using an on-chip resistor that models an impedance of an antenna that is externally coupled to said power amplifier when in a transmit mode, wherein:
said calibrating comprises coupling said power amplifier to said on-chip resistor when said power amplifier is decoupled from said antenna and measuring a power level at one or more stages in a transmit chain in the transmitter; and
said one or more stages are located prior to an output of said power amplifier.

2. The method according to claim 1, comprising controlling said output power of said power amplifier based on a voltage that is measured at an input of said power amplifier.

3. The method according to claim 2, comprising detecting said voltage at said input of said power amplifier.

4. The method according to claim 3, comprising detecting said voltage at an output of a power amplifier driver coupled to said input of said power amplifier.

5. The method according to claim 2, comprising controlling said output power of said power amplifier based on said voltage that is measured prior to said input of said power amplifier.

6. The method according to claim 5, comprising detecting one or more voltages at one or more locations in said transmit chain prior to said input of said power amplifier.

7. The method according to claim 6, comprising generating a gain based on said detected one or more voltages.

8. The method according to claim 7, comprising controlling said output power of said power amplifier based on said generated gain.

9. The method according to claim 1, comprising selecting a reverse isolation gain of said power amplifier for reducing the effect of VSWR.

10. The method according to claim 1, wherein said antenna is decoupled from said power amplifier during said calibration.

11. The method according to claim 1, where said on-chip resistor is integrated in a transmit/receive switch coupled to said transmitter.

12. A system for controlling circuitry within a transmitter, the system comprising:
one or more circuits within a chip that calibrate an output power of a power amplifier integrated within said chip using an on-chip resistor that models an impedance of an antenna that is externally coupled to said power amplifier when in a transmit mode; wherein:
said calibration comprises coupling said power amplifier to said on-chip resistor when said power amplifier is decoupled from said antenna and measuring a power level at one or more stages in a transmit chain of the transmitter; and
said one or more stages are located prior to an output of said power amplifier.

13. The system according to claim 12, wherein said one or more circuits controls an output power of said power amplifier based on a voltage that is measured at an input of said power amplifier.

14. The system according to claim 13, wherein said one or more circuits detects a voltage at said input of said power amplifier.

15. The system according to claim 14, wherein said one or more circuits detects said voltage at an output of a PAD coupled to said input of said power amplifier.

16. The system according to claim 13, wherein said one or more circuits controls said output power of said power amplifier based on said voltage, which is measured prior to said input of said power amplifier.

17. The system according to claim 16, wherein said one or more circuits detects one or more voltages at one or more corresponding locations in said transmit chain prior to said input of said power amplifier.

18. The system according to claim 17, wherein said one or more circuits generates a gain based on said detected one or more voltages.

19. The system according to claim 18, wherein said one or more circuits controls said output of said power amplifier based on said generated gain.

20. The system according to claim 12, wherein said one or more circuits is selected for a reverse isolation gain of said power amplifier for reducing the effect of VSWR.

21. The system according to claim 12, wherein said antenna is decoupled from said power amplifier during said calibration.

22. The system according to claim 12, wherein said on-chip resistor is integrated in a transmit/receive switch coupled to said transmitter.

23. A method for controlling a circuit within a transmitter, the method comprising: calibrating an output power of a power amplifier integrated within a chip using an on-chip resistor that models an impedance of an antenna that is externally coupled to said power amplifier when in transmit mode, and one or more on-chip voltage detectors that are coupled to one or more stages in a transmit chain of the transmitter, wherein said calibrating comprises coupling said power amplifier to said on-chip resistor when said power amplifier is decoupled from said antenna and measuring a power level at one or more of said stages prior to an output of said power amplifier in said transmit chain.

24. The method according to claim 23, comprising detecting one or more voltages by corresponding said one or more on-chip voltage detectors.

25. The method according to claim 24, comprising generating a gain based on said detected one or more voltages.

26. The method according to claim 25, comprising controlling said output power of said power amplifier based on said generated gain.

* * * * *